(12) United States Patent
Yella

(10) Patent No.: US 7,795,902 B1
(45) Date of Patent: Sep. 14, 2010

(54) INTEGRATED CIRCUIT DEVICE WITH SLEW RATE CONTROLLED OUTPUT BUFFER

(75) Inventor: Anitha Yella, Starke, FL (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/510,808

(22) Filed: Jul. 28, 2009

(51) Int. Cl.
*H03K 17/16* (2006.01)
*H03K 19/003* (2006.01)

(52) U.S. Cl. .............................. 326/26; 326/27; 326/32; 326/34

(58) Field of Classification Search ........................ None
See application file for complete search history.

(56) References Cited

U.S. PATENT DOCUMENTS

| 4,251,739 | A | | 2/1981 | Morozumi |
| 7,154,332 | B2 | * | 12/2006 | Tsuchi ........................ 330/255 |
| 2006/0091955 | A1 | * | 5/2006 | Choi ........................... 330/260 |
| 2008/0019159 | A1 | * | 1/2008 | Song et al. .................... 363/62 |

OTHER PUBLICATIONS

Garcia, F. et al., "Design of a Slew Rate Controlled Output Buffer," *Proc. of the Eleventh Annual IEEE International ASIC Conference 1998*, Sep. 13-16, 1998, pp. 147-150, Rochester, NY.

* cited by examiner

*Primary Examiner*—Anh Q Tran
(74) *Attorney, Agent, or Firm*—Kenneth Glass; Lois D. Cartier

(57) ABSTRACT

An integrated circuit device includes an output buffer having a capacitance circuit configurable in a slew rate configuration or a decoupling configuration. In the slew rate configuration, the capacitance circuit electrically couples a capacitor of the capacitance circuit in a feedback path for reducing a slew rate of a buffered output signal generated by the output buffer. In the decoupling configuration, the capacitance circuit electrically couples the capacitor between a power potential and a ground potential of the output buffer for increasing power noise immunity of the output buffer. The output buffer may have more than capacitance circuit, each of which is individually configurable into the slew rate configuration or the decoupling configuration.

15 Claims, 7 Drawing Sheets

INTEGRATED CIRCUIT DEVICE WITH SLEW RATE CONTROLLED OUTPUT BUFFER

FIELD OF THE INVENTION

The present invention relates to integrated circuit devices. More particularly, the present invention relates to output buffers for integrated circuit devices.

BACKGROUND

An integrated circuit device typically includes output buffers for driving resistive-capacitive-inductive loads external to the integrated circuit device. Capacitive components of the external loads may include capacitances of bond wires and package pins in an integrated circuit package containing the integrated circuit device, as well as input capacitances of gates connected to the output buffers. Inductive components of the external loads may include inductances of power and ground lines external to the integrated circuit device that are electrically connected to the output buffers. For instance, the power and ground lines may be conductive traces on a printed circuit board containing the integrated circuit device. A resistive component of the external loads includes resistances of interconnects electrically connected to the output buffers and may also include pull-up or pull-down circuits electrically connected to the interconnects. For example, the interconnects may be conductive traces on a printed circuit board that are connected to package pins of the integrated circuit package.

A traditional output buffer of an integrated circuit device includes a chain of inverters in which the sizes of transistors are selected based on the external load of the output buffer. Because of the transistor sizing in the inverter chain, output buffers of an integrated circuit device may have high slew rates. In such an integrated circuit device these output buffers may switch simultaneously, causing an unacceptably high peak current in the integrated circuit device. Additionally, the simultaneous switching of the output buffers may cause power noise, resulting in an unacceptable voltage drop in power supplied to the output buffers. Moreover, simultaneous switching of the output buffers at high slew rates may generate an unacceptable level of electromagnetic interference emitted from the integrated circuit device.

In light of the above, a need exists for controlling the slew rate of an output buffer. A further need exists for increasing the power noise immunity of an output buffer.

SUMMARY

In various embodiments, an integrated circuit device includes an output buffer configurable in a select one of a slew rate configuration or a decoupling configuration. In the slew rate configuration, the capacitance circuit electrically couples a capacitor of the capacitance circuit in a feedback path for reducing a slew rate of a buffered output signal generated by the output buffer. In the decoupling configuration, the capacitance circuit electrically couples the capacitor between a power potential and a ground potential of the output buffer for increasing the power noise immunity of the output buffer. In this way, the capacitance circuit increases power noise immunity of the output buffer when the capacitor in the capacitance circuit is not being used to reduce the slew rate of the buffered output signal.

In further embodiments, the output buffer includes more than one capacitance circuit, each of which is individually configurable into a selected one of the slew rate configuration or the decoupling configuration. Moreover, each of the capacitance circuits configured in the slew rate configuration reduces the slew rate of the buffered output signal. In this way, the slew rate of the buffered output signal is programmable based on the configurations of the component capacitance circuits. Further, each capacitance circuit in the decoupling configuration increases the power noise immunity of the output buffer.

An integrated circuit device, in accordance with an embodiment of the present invention, includes an output buffer and an output buffer controller coupled to the output buffer. The output buffer is configured to receive an unbuffered output signal and generate a buffered output signal based on the unbuffered output signal. Further, the output buffer includes a capacitance circuit configurable into a selected one of a slew rate configuration for controlling a slew rate of the buffered output signal or a decoupling configuration for increasing power noise immunity of the output buffer. The output buffer controller is configured to select one of the slew rate configuration or the decoupling configuration of the capacitance circuit.

An output buffer, in accordance with another embodiment of the present invention, includes an input circuit, a biasing circuit, a capacitance circuit, and an output circuit. The output circuit is coupled to the input circuit and the capacitance circuit. Additionally, the biasing circuit is coupled to the input circuit and the capacitance circuit. The input circuit is configured to receive an unbuffered output signal and to generate an inverted output signal, a pullup control signal, and a pulldown control signal, based on the unbuffered output signal. The output circuit is configured to generate a pullup component signal based on the pullup control signal and a pulldown component signal based on the pulldown control signal. Further, the output circuit is configured to generate a buffered output signal comprising the pullup component signal and the pulldown component signal. The capacitance circuit is configurable into a selected one of a slew rate configuration for reducing a slew rate of the buffered output signal or a decoupling configuration for increasing power noise immunity of the output buffer. Moreover, the capacitance circuit is configured to generate a feedback signal based on the buffered output signal in the slew rate configuration. The biasing circuit is configured to generate both a pullup bias signal for biasing the pullup control signal and a pulldown bias signal for biasing the pulldown control signal based on the feedback signal when the capacitance circuit is in the slew rate configuration.

A method of controlling a slew rate of an output buffer, in accordance with another embodiment of the present invention, includes receiving an unbuffered output signal at the output buffer. Additionally, the method includes generating a pullup control signal based on the unbuffered output signal and generating a pulldown control signal based on the unbuffered output signal. The method further includes receiving a select control signal and selecting a slew rate configuration for controlling a slew rate of the buffered output signal or a decoupling configuration for increasing power noise immunity of the output buffer, based on a value of the select control signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, an integrated circuit device includes an output buffer having a capacitance circuit configurable in a selected one of a slew rate configuration or a decoupling configuration. In the slew rate configuration, the capacitance circuit reduces a slew rate of a buffered output signal generated by the output buffer. In the decoupling configuration, the capacitance circuit increases the power noise immunity of the output buffer. In further embodiments, the output buffer may have more than one capacitance circuit, each of which is individually configurable into an associated one of the slew rate configuration or the decoupling configuration.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail, so as not to unnecessarily obscure aspects of the present invention.

Figure 1:
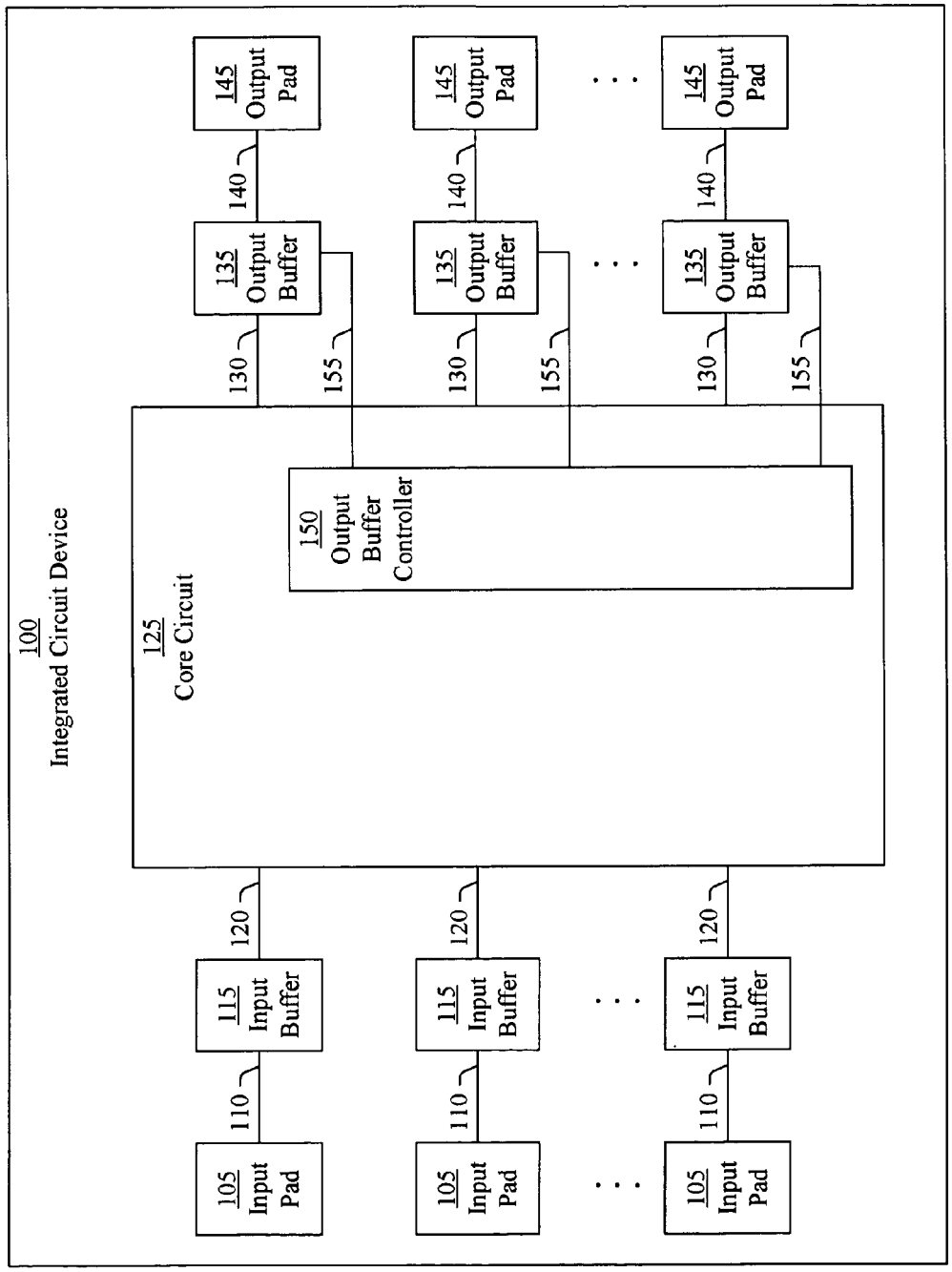
FIG. 1 is block diagram of an integrated circuit device, in accordance with an embodiment of the present invention.

FIG. 1 illustrates an integrated circuit device 100, in accordance with an embodiment of the present invention. Integrated circuit device 100 includes input pads 105, input buffers 115, a core circuit 125, output buffers 135, and output pads 145. Input pads 105 are coupled (e.g., connected, but not necessarily directly connected) to corresponding input buffers 115 and output pads 145 are coupled to corresponding output buffers 135. Additionally, input buffers 115 and output buffers 135 are coupled to core circuit 125.

In various embodiments, core circuit 125 may be any type of electrical circuit and may include analog circuits or digital circuits, or both. In some embodiments, integrated circuit device 100 is a programmable integrated circuit, e.g., a programmable logic device (PLD), such as a field programmable gate array (FPGA). In various embodiments, the integrated circuit device is an integrated circuit formed on a semiconductor die and may include an integrated circuit package containing the integrated circuit. For example, integrated circuit device 100 may be a multichip package containing more than one semiconductor die containing the integrated circuit.

Each of input pads 105 receives an input signal 110 and provides the respective input signal 110 to a corresponding input buffer 115. In turn, each input buffer 115 generates a buffered input signal 120 and provides the buffered input signal 120 to core circuit 125. Core circuit 125 generates unbuffered output signals 130 and provides the output signals 130 to corresponding output buffers 135. (Note that the term "unbuffered output signal" as used herein refers to an output signal input to, i.e., provided to, an output buffer of an integrated circuit. An "unbuffered output signal" may, however, be buffered within the core circuit, e.g., to increase the speed of the output signal path.) In turn, each of the output buffers 135 generates a buffered output signal 140 based on the unbuffered output signal 130 received by the output buffer 135, and provides the buffered output signal 140 to a corresponding output pad 145. Further, core circuit 125 includes an output buffer controller 150. Output buffer controller 150 generates select control signals 155 and provides the select control signals 155 to corresponding output buffers 135 for controlling slew rates of the output buffers 135. Moreover, each of the output buffers 135 is configurable into a selected one of a slew rate configuration for reducing the slew rate of the output buffer 135 or a decoupling configuration for increasing power noise immunity of output buffer 135, based on the value of control signal 155 received by output buffer 135. In this way, output buffer controller 150 programs the slew rate of output buffer 135 and may increase the power noise immunity of output buffer 135.

In various embodiments, output buffer controller 150 individually controls the configuration of each output buffer 135 based on the respective select control signal 155 received by the output buffer 135. Although three output buffers 135 and three output pads 145 are illustrated in FIG. 1, integrated circuit device 100 may include more or fewer than three output buffers 135, and more or fewer than three output pads 145, in other embodiments. For example, integrated circuit device 100 may include a single output buffer 135 and a single output pad 145. Moreover, although three input pads 105 and three input buffers 115 are illustrated in FIG. 1, the integrated circuit device 100 may include more or fewer than three input pads 105, and more or fewer than three input buffers 115, in other embodiments. For example, integrated circuit device 100 need not include an input pad 105 or an input buffer 115. In some embodiments, one or more of output buffers 135 may perform a function of an input buffer 115 and one or more of the output pads 145 may perform a function of an input pad 105. For example, an output buffer 135 may be an input-output buffer for generating both a buffered output signal 140 and a buffered input signal 120.

Figure 2:
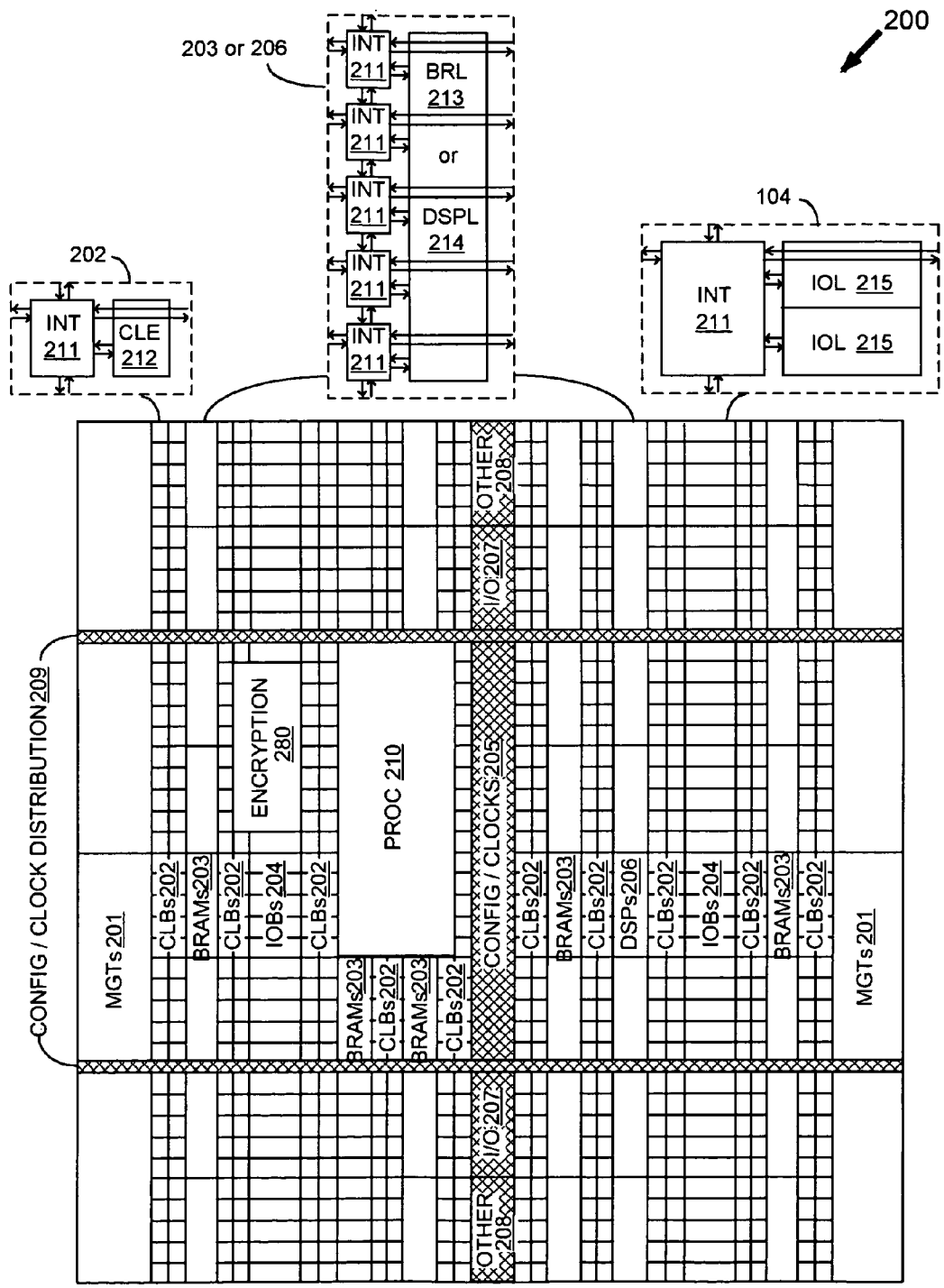
FIG. 2 is a block diagram of an integrated circuit device having a field programmable gate array architecture, in accordance with an embodiment of the present invention.

FIG. 2 is a block diagram of integrated circuit device 100, in accordance with an embodiment of the present invention. In the embodiment of FIG. 2, integrated circuit device 100 is a field programmable gate array (FPGA) having a FPGA architecture 200 that includes a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, specialized input/output blocks (I/O) 207 (e.g., configuration ports and clock ports), and other programmable logic 208 such as digital clock managers, analog-to-digital converters, system monitoring logic, and so forth. In addition, the FPGA architecture 200 may include one or more dedicated blocks such as a processor block (PROC) 210 and/or an encryption logic block (ENCRYPTION) 280, for example.

In some embodiments, each programmable tile of the FPGA architecture 200 includes a programmable interconnect element (INT) 211 having standardized connections to and from a corresponding programmable interconnect element (INT) 211 in each adjacent tile. Therefore, the programmable interconnect elements (INT) 211 taken together implement a programmable interconnect structure for the FPGA architecture 200. The programmable interconnect element (INT) 211 also includes the connections to and from the programmable logic 208 within the same tile, as shown by the examples included at the top of FIG. 2.

For example, a CLB 202 can include a configurable logic element (CLE) 212 that can be programmed to implement user logic and a single programmable interconnect element (INT) 211. A BRAM 203 can include a BRAM logic element (BRL) 213 in addition to one or more programmable interconnect elements (INT) 211. Typically, the number of programmable interconnect elements (INT) 211 included in a tile depends on the height of the tile. In the pictured embodiment, a BRAM 203 has the same height as five CLBs 202, but other numbers of interconnected elements (e.g., six) can also be used. A DSP block 206 can include a DSP logic element (DSPL) 214 in addition to an appropriate number of programmable interconnect elements (INT) 211. An IOB 204 can include, for example, two instances of an input/output logic element (IOL) 215 in addition to one instance of the programmable interconnect element (INT) 211. As will be clear to those of skill in the art, the actual I/O pads connected, for example, to the input/output logic element (IOL) 215 are manufactured using metal layered on the various illustrated logic blocks, and typically are not confined to the area of the input/output logic element (IOL) 215.

Configuration/clock distribution logic 205 includes configuration, clock, and other control logic. Horizontal areas 209 extending from this column are used to distribute the clocks and configuration signals across the breadth of the FPGA. In some embodiments, the FPGA architecture 200 illustrated in FIG. 2 includes additional logic blocks that disrupt the regular columnar structure making up a large part of the FPGA architecture 200. The additional logic blocks can be programmable blocks and/or dedicated logic. For example, the processor block (PROC) 210 shown in FIG. 2 spans several columns of CLBs 202 and BRAMs 203.

FIG. 2 is intended to illustrate an exemplary FPGA architecture 200. The numbers of logic blocks in a column, the relative width of the columns, the number and order of columns, the types of logic blocks included in the columns, the relative sizes of the logic blocks, the incorporation of hard blocks such as processor block (PROC) 210, and the interconnect/logic implementations included at the top of FIG. 2 will vary in accordance with the requirements of each application. In various embodiments, the FPGA architecture 200 has more than one adjacent column of CLBs 202 to facilitate the efficient implementation of user logic, but the number of adjacent columns of CLBs 202 varies with the overall size of the FPGA architecture 200.

Figure 3:
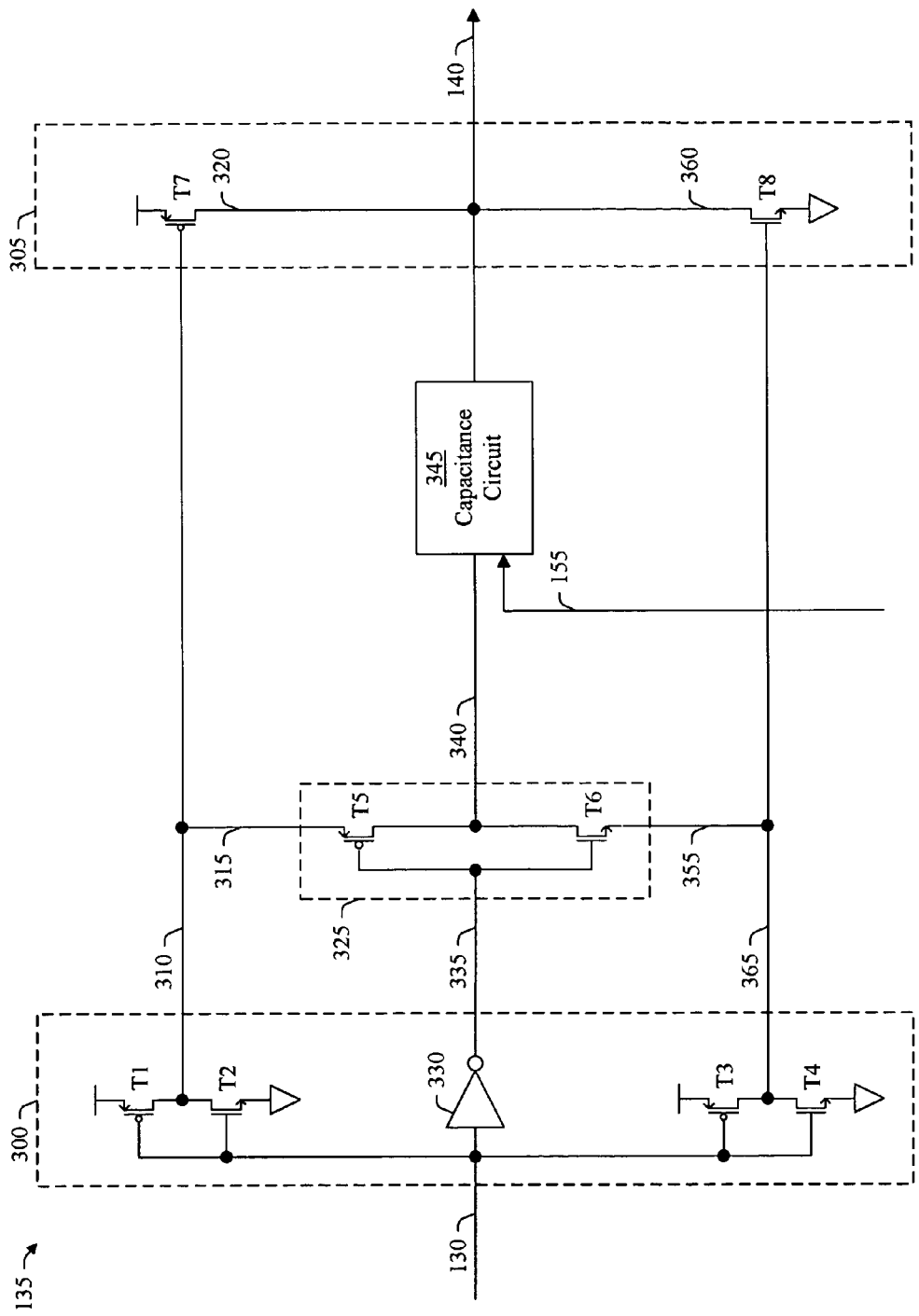
FIG. 3 is a schematic diagram of a first output buffer, in accordance with an embodiment of the present invention.

FIG. 3 illustrates a first embodiment of output buffer 135, in accordance with an embodiment of the present invention. In the embodiment of FIG. 3, output buffer 135 includes an input circuit 300, a biasing circuit 325, a capacitance circuit 345, and an output circuit 305. Biasing circuit 325 is coupled to input circuit 300, capacitance circuit 345, and output circuit 305. Additionally, output circuit 305 is coupled to input circuit 300 and capacitance circuit 345. Input circuit 300 receives unbuffered output signal 130 and generates a pullup control signal 310 and a pulldown control signal 365 based on the unbuffered output signal 130. Pullup control signal 310 controls a rising slew rate of buffered output signal 140 generated by output buffer 135. Pulldown control signal 365 controls a falling slew rate of buffered output signal 140. Additionally, input circuit 300 generates an inverted output signal 335 by inverting unbuffered output signal 130.

Output circuit 305 generates buffered output signal 140 based on the values of pullup control signal 310 and pulldown control signal 365. Further, output circuit 305 provides buffered output signal 140 to capacitance circuit 345. In the slew rate configuration, capacitance circuit 345 generates a feedback signal 340 based on the value of buffered output signal 140 and provides the feedback signal 340 to biasing circuit 325. In turn, biasing circuit 325 generates a pullup bias signal 315 based on the value of inverted output signal 335 and feedback signal 340, for biasing pullup control signal 310 to reduce the rising slew rate of buffered output signal 140. Also in the slew rate configuration, biasing circuit 325 generates a pulldown bias signal 355 based on the values of inverted output signal 335 and feedback signal 340, for biasing pulldown control signal 365 to reduce the falling slew rate of buffered output signal 140. In this way, capacitance circuit 345 reduces the slew rate of buffered output signal 140 in the slew rate configuration.

In the decoupling configuration, capacitance circuit 345 provides a decoupling capacitance between a power potential and a ground potential of output buffer 135. For example, the power potential of output buffer 135 may be an input of output buffer 135 for coupling to a voltage potential of a power supply, and the ground potential of output buffer 135 may be an input of output buffer 135 for coupling to a ground potential of the power supply. In this way, capacitance circuit 345 increases the power noise immunity of output buffer 135 in the decoupling configuration.

In the embodiment of FIG. 3, input circuit 300 includes an inverter 330 for generating inverted output signal 335 by inverting the unbuffered output signal 130. In various embodiments, inverted output signal 335 is symmetrical to unbuffered output signal 130. The input circuit 300 also includes a transistor T1 and a transistor T2 for generating pullup control signal 310. As illustrated in FIG. 3, transistor T1 is a positive-channel metal oxide semiconductor (PMOS) transistor and transistor T2 is a negative-channel metal oxide semiconductor (NMOS) transistor. Transistor T1 includes a gate for receiving unbuffered output signal 130, a source coupled to the power potential of output buffer 135, and a drain for generating a portion of pullup control signal 310. Transistor T2 includes a gate for receiving unbuffered output signal 130, a source coupled to the ground potential of output buffer 135, and a drain for generating a portion of pullup control signal 310. In various embodiments, the sizes of transistors T1 and T2 (e.g., lengths and widths) are selected to generate a substantially constant current in pullup control signal 310. For example, the width of transistor T1 may be wider than the width of transistor T2.

Input circuit 300 also includes a transistor T3 and a transistor T4 for generating the pulldown control signal 365. As illustrated in FIG. 3, transistor T3 is a PMOS transistor and transistor T4 is an NMOS transistor. Transistor T3 includes a gate for receiving unbuffered output signal 130, a source coupled to the power potential of output buffer 135, and a drain, for generating a portion of pulldown control signal 365. Transistor T4 includes a gate for receiving unbuffered output signal 130, a source coupled to the ground potential of output buffer 135, and a drain coupled to the drain of transistor T3, for generating a portion of pulldown control signal 365. In various embodiments, the sizes of transistors T3 and T4 (e.g., lengths and widths) are selected to generate a substantially constant current in pulldown control signal 365. For example, the width of transistor T3 may be wider than the width of transistor T4.

Biasing circuit 325 includes a transistor T5 for generating pullup bias signal 315 and a transistor T6 for generating pulldown bias signal 355. As illustrated in FIG. 3, transistor T5 is a PMOS transistor and transistor T6 is an NMOS transistor. Transistor T5 includes a gate for receiving inverted output signal 335, a drain for receiving feedback signal 340, and a source for generating pullup bias signal 315. Transistor T6 includes a gate for receiving inverted output signal 335, a drain for receiving feedback signal 340, and a source for generating pulldown bias signal 355.

Output circuit 305 includes a transistor T7 for generating a pullup component signal 320 of buffered output signal 140 and a transistor T8 for generating a pulldown component signal 360 of buffered output signal 140. Accordingly, buffered output signal 140 includes pullup component signal 320 and pulldown component signal 360. As illustrated in FIG. 3, transistor T7 is a PMOS transistor and transistor T8 is an NMOS transistor. Transistor T7 includes a gate for receiving pullup control signal 310, a source coupled to the power potential of output buffer 135, and a drain, for generating pullup component signal 320. Transistor T8 includes a gate for receiving pulldown control signal 365, a source coupled to the ground potential of output buffer 135, and a drain for generating pulldown component signal 360. In various embodiments, transistors T7 and T8 are sized to drive a current (e.g., a predetermined current) into a load at a slew rate (e.g., a predetermined slew rate) when output buffer 135 is in the decoupling configuration. Moreover, inverter 330 and transistors T1-T6 are sized such that transistors T7 and T8 drive a reduced current (e.g., a reduced predetermined current) into a load at a reduced slew rate (e.g., a reduced predetermined slew rate) when output buffer 135 is in the slew rate configuration.

Figure 4:
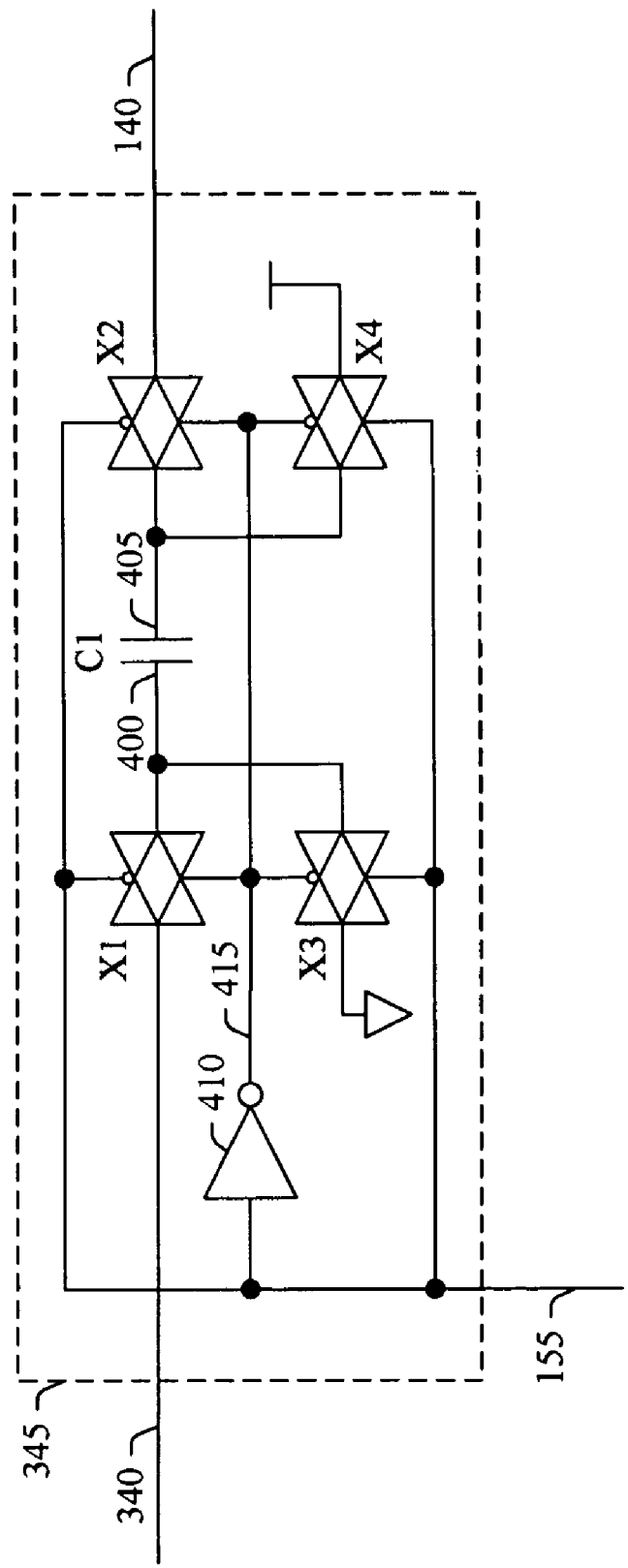
FIG. 4 is a schematic diagram of a first capacitance circuit, in accordance with an embodiment of the present invention.

FIG. 4 illustrates a first embodiment of capacitance circuit 345, in accordance with an embodiment of the present invention. Capacitance circuit 345 includes an inverter 410, a capacitor C1, and transmission gates X1-X4. Each of transmission gates X1-X4 is coupled to inverter 410 and capacitor C1. Capacitor C1 has two terminals 400 and 405. The transmission gate X1 is coupled between feedback signal 340 from biasing circuit 325 and terminal 400 of capacitor C1. Transmission gate X2 is coupled between buffered output signal 140 from output circuit 305 and terminal 405 of capacitor C1. Transmission gate X3 is coupled between terminal 400 of capacitor C1 and the ground potential of output buffer 135. Transmission gate X4 is coupled between terminal 405 of capacitor C1 and the power potential of output buffer 135.

Inverter 410 generates an inverted select control signal 415 by inverting select control signal 155. Moreover, select control signal 155 and inverted select control signal 415 together control operation of transmission gates X1-X4. In some embodiments, inverter 410 is optional in capacitance circuit 345. In these embodiments, capacitance circuit 345 receives select control signal 155 and inverted select control signal 415. For example, output buffer controller 150 (see FIG. 1) may generate select control signal 155 and inverted select control signal 415, and provide both signals to the output buffer 135.

In the slew rate configuration, transmission gate X2 passes buffered output signal 140 to terminal 405 of capacitor C1 based on the values of select control signal 155 and inverted select control signal 415. In turn, capacitor C1 generates a feedback signal based on the buffered output signal 140, and transmission gate X1 provides feedback signal 340 to biasing circuit 325 based on the values of select control signal 155 and inverted select control signal 415. In this way, capacitance circuit 345 electrically couples capacitor C1 in a feedback path from output circuit 305 to biasing circuit 325 in the slew rate configuration for reducing the slew rate of buffered output signal 140. Further in the slew rate configuration, transmission gate X3 electrically isolates (e.g., electrically decouples) terminal 400 of capacitor C1 from the ground potential of output buffer 135 based on the values of select control signal 155 and inverted select control signal 415, and transmission gate X4 electrically isolates terminal 405 of capacitor C1 from the power potential of output buffer 135 based on the values of select control signal 155 and inverted select control signal 415.

In the decoupling configuration, transmission gate X4 electrically couples the power potential of output buffer 135 to terminal 405 of capacitor C1 based on the values of select control signal 155 and inverted select control signal 415. Additionally, transmission gate X3 electrically couples the ground potential of output buffer 135 to terminal 400 of capacitor C1 based on the values of select control signal 155 and inverted select control signal 415. In this way, capacitance circuit 345 electrically couples capacitor C1 between the power potential and the ground potential of output buffer 135 in the decoupling configuration, for increasing the power noise immunity of output buffer 135. Accordingly, capacitor C1 functions as a decoupling capacitor in the decoupling configuration. Further in the decoupling configuration, transmission gate X2 electrically isolates terminal 405 of capacitor C1 from output circuit 305 based on the values of select control signal 155 and inverted select control signal 415, and transmission gate X1 electrically isolates terminal 400 of capacitor C1 from the biasing circuit 325 based on the values of select control signal 155 and inverted select control signal 415.

Figure 5:
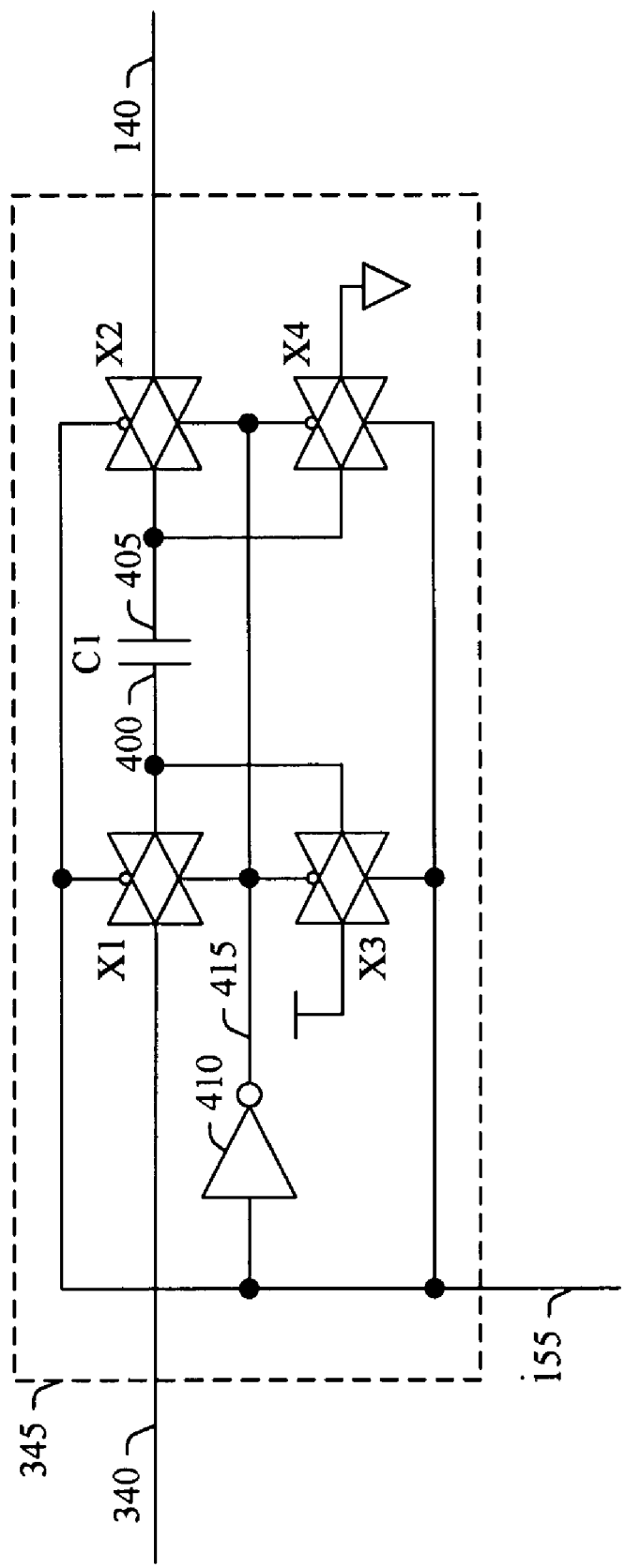
FIG. 5 is a schematic diagram of a second capacitance circuit, in accordance with an embodiment of the present invention.

FIG. 5 illustrates a second embodiment of capacitance circuit 345, in accordance with an embodiment of the present invention. In the embodiment of FIG. 5, capacitance circuit 345 includes inverter 410, capacitor C1, and transmission gates X1-X4, as illustrated in FIG. 4. Moreover, inverter 410, capacitor C1, and transmission gates X1-X4 in the embodiment of FIG. 5 are coupled to each other in the same manner as illustrated in FIG. 4, except that transmission gate X3 is coupled to the power potential instead of the ground potential of output buffer 135, and transmission gate X4 is coupled to the ground potential instead of the power potential of output buffer 135.

In the embodiment of FIG. 5, in the slew rate configuration, transmission gate X2 passes buffered output signal 140 to terminal 405 of capacitor C1 based on the values of control signal 155 and inverted control signal 415. In turn, capacitor C1 generates feedback signal 340 based on the buffered output signal 140, and transmission gate X1 provides feedback signal 340 to biasing circuit 325 based on the values of select control signal 155 and inverted select control signal 415. In this way, capacitance circuit 345 electrically couples capacitor C1 in a feedback path from output circuit 305 to biasing circuit 325 in the slew rate configuration, for reducing the slew rate of buffered output signal 140. Further in the slew rate configuration, transmission gate X3 electrically isolates terminal 400 of capacitor C1 from the ground potential of output buffer 135 based on the values of select control signal 155 and inverted select control signal 415, and transmission gate X4 electrically isolates terminal 405 of capacitor C1 from the power potential of output buffer 135 based on the values of select control signal 155 and inverted select control signal 415.

In the decoupling configuration, transmission gate X4 electrically couples the ground potential of output buffer 135 to terminal 405 of capacitor C1 based on the values of select control signal 155 and inverted select control signal 415. Additionally, transmission gate X3 electrically couples the power potential of output buffer 135 to terminal 400 of capacitor C1 based on the values of select control signal 155 and inverted select control signal 415. In this way, capacitance circuit 345 electrically couples capacitor C1 between the power potential of output buffer 135 and the ground potential of output buffer 135 in the decoupling configuration, for reducing the power noise immunity of output buffer 135. Accordingly, capacitor C1 functions as a decoupling capacitor in the decoupling configuration.

Figure 6:
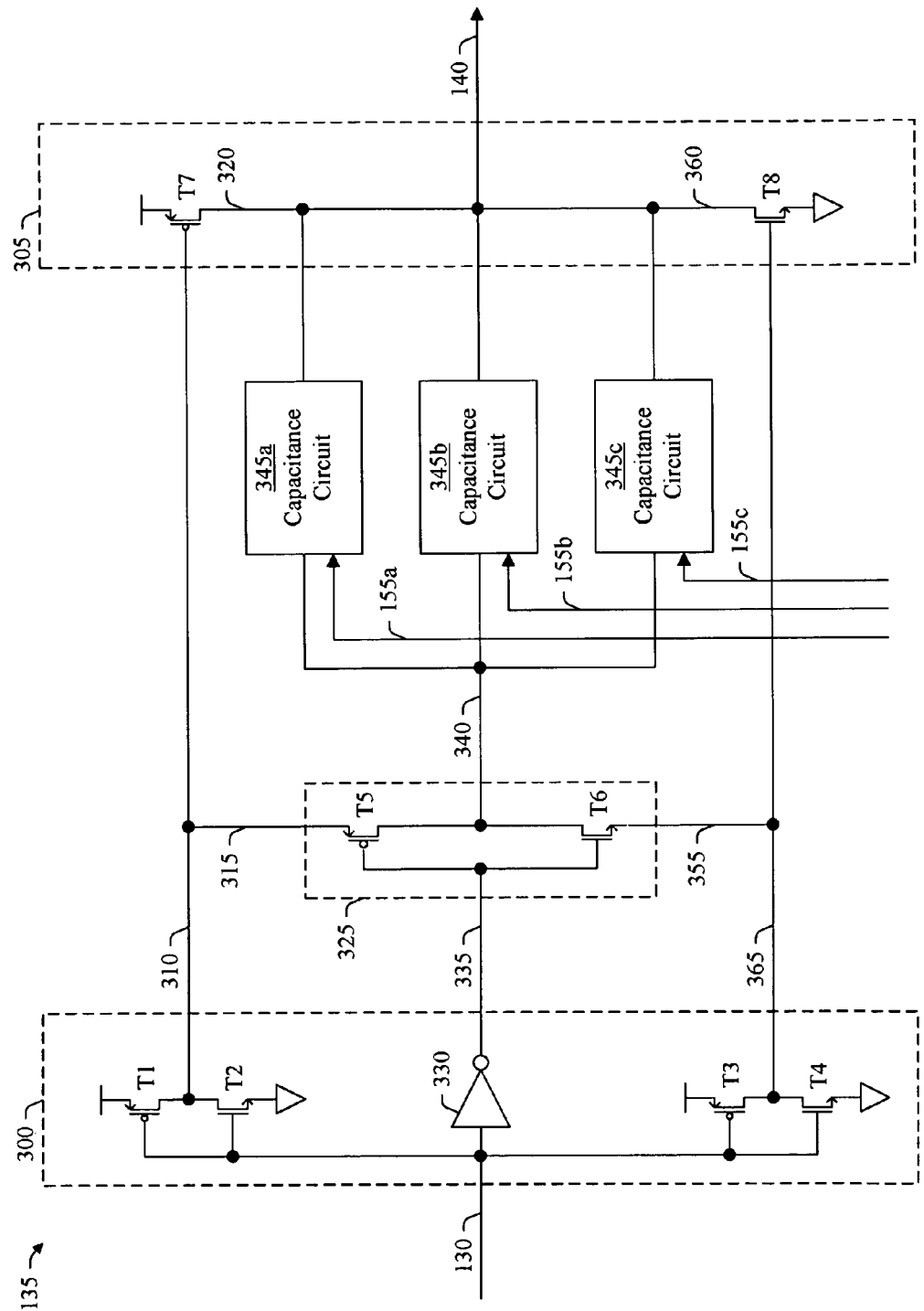
FIG. 6 is a block diagram of a second output buffer, in accordance with an embodiment of the present invention.

FIG. 6 illustrates a second embodiment of output buffer 135, in accordance with an embodiment of the present invention. In the embodiment of FIG. 6, output buffer 135 includes input circuit 300, biasing circuit 325, and output circuit 305 as illustrated in FIG. 3. Moreover, input circuit 300, biasing circuit 325, and output circuit 305 in the embodiment of FIG. 6 are coupled to each other in the same manner illustrated in FIG. 3. However, in contrast to the embodiment of FIG. 3, the embodiment of output buffer 135 illustrated in FIG. 6 includes three capacitance circuits 345 (e.g., capacitance circuits 345a-345c) and receives three select control signals 155 (e.g., control signals 155a-155c) corresponding to the capacitance circuits 345a-345c. Moreover, in the embodiment of FIG. 6, each capacitance circuit 345a-345c is coupled to input circuit 300, biasing circuit 325, and output circuit 305 in the same manner in which capacitance circuit 345 of FIG. 3 is coupled to input circuit 300, biasing circuit 325, and output circuit 305 of FIG. 3.

In the embodiment of FIG. 6, each capacitance circuit 345a-345c is individually configurable into the slew rate configuration or the decoupling configuration, based on the value of the respective select control signal 155a-155c received by the capacitance circuit 345a-345c. In other embodiments (not shown), the capacitance circuits 345a-345c receive the same control signal 155 and are configurable into the slew rate configuration or the decoupling configuration based on the value of a single select control signal 155. Although three capacitance circuits 345a-345c are illustrated in FIG. 6, the output buffer 135 may have more or fewer than three capacitance circuits in other embodiments.

Figure 7:
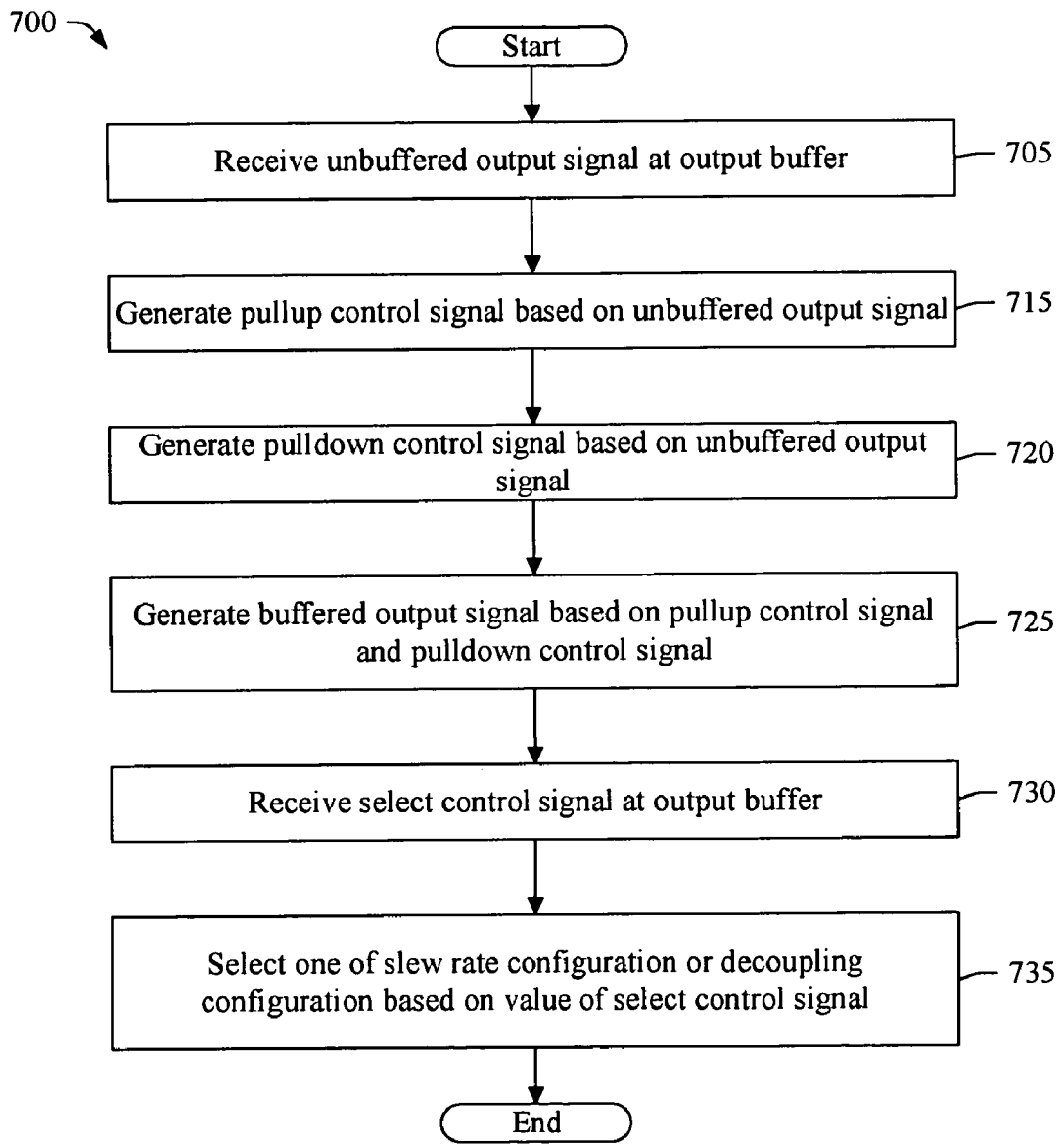
FIG. 7 is a flow chart of a method of controlling a slew rate of an output buffer, in accordance with an embodiment of the present invention.

FIG. 7 illustrates a method 700 of controlling a slew rate of an output buffer, in accordance with an embodiment of the present invention. In step 705, an unbuffered output signal is received at an output buffer. In various embodiments, the output buffer 135 receives the unbuffered output signal 130 at the output buffer 135. In some embodiments, the core circuit 125 of the integrated circuit device 100 generates the unbuffered output signal 130 and provides the unbuffered output signal 130 to the output buffer 135. Method 700 then proceeds to step 715.

In step 715, a pullup control signal is generated based on the unbuffered output signal. In various embodiments, the input circuit 300 of the output buffer 135 receives the unbuffered output signal 130 and generates the pullup control signal 310 based on the unbuffered output signal 130. In some embodiments, the input circuit 300 includes the transistors T1 and T2 for generating the pullup control signal 310 based on the unbuffered output signal 130. Method 700 then proceeds to step 720.

In step 720, a pulldown control signal is generated based on the unbuffered output signal. In various embodiments, the input circuit 300 of the output buffer 135 receives the unbuffered output signal 130 and generates the pulldown control signal 365 based on the unbuffered output signal 130. In some embodiments, the input circuit 300 includes the transistors T3 and T4 for generating the pulldown control signal 365 based on the unbuffered output signal 130. Method 700 then proceeds to step 725.

In step 725, a buffered output signal is generated based on the pullup control signal and the pulldown control signal. In various embodiments, the output circuit 305 of the output buffer 135 generates the buffered output signal 140 based on the pullup control signal 310 and the pulldown control signal 365. In some embodiments, the output circuit 305 includes the transistor T7 for generating the pullup component signal 320 of the buffered output signal 140 based on the pullup control signal 310. In these embodiments, the output circuit 305 also includes the transistor T8 for generating the pulldown component signal 360 of the buffered output signal 140 based on the pulldown control signal 365. The method 700 then proceeds to step 730.

In step 730, a select control signal is received at the output buffer. In various embodiments, a capacitance circuit 345 of the output buffer 135 receives the select control signal 155 at the output buffer 135. In some embodiments, the output buffer controller 150 of the integrated circuit device 100 generates the select control signal 155 and provides the select control signal 155 to the output buffer 135. The method 700 then proceeds to step 735.

In step 735, one of a slew rate configuration or a decoupling configuration is selected based on the value of the select control signal. In various embodiments, the capacitance circuit 345 of the output buffer 135 selects one of a slew rate configuration or a decoupling configuration of the capacitance circuit 345 based on the value of select control signal 155. In this way, the capacitance circuit 345 also selects one of a slew rate configuration or a decoupling configuration of the output buffer 135.

In the slew rate configuration of the capacitance circuit 345, the capacitance circuit 345 electrically couples the capacitor C1 of the capacitance circuit 345 in a feedback path between the output circuit 305 and the biasing circuit 325 for reducing the slew rate of the buffered output signal 140. Additionally, the input circuit 300 generates the inverted output signal 335 by inverted the unbuffered output signal 130. Moreover, the capacitance circuit 345 generates the feedback signal 340 based on the buffered output signal 140 and the biasing circuit 325 generates both the pullup bias signal 315 and the pulldown bias signal 355 based on the feedback signal 340 and the inverted output signal 335. In turn, the pullup control signal 310 is biased based on the pullup bias signal 315 and the pulldown control signal 365 is biased based on the pulldown bias signal 355.

In the decoupling configuration, the capacitance circuit 345 electrically couples the capacitor C1 of the capacitance circuit 345 in a decoupling path between the power potential and the group potential of the output buffer 135. In this way, the capacitance circuit 345 provides a decoupling capacitance between the power potential and the group potential of the output buffer 135 for increasing power noise immunity of the output buffer 135.

In some embodiments, the output buffer 135 includes more than one capacitance circuit 345. In these embodiments, each of the capacitance circuits 345 in the output buffer 135 selects the slew rate configuration or the decoupling configuration of the capacitance circuit 345 based on the control signal 155. In further embodiments, the output buffer controller 150 in the integrated circuit device100 generates a respective control signal 155 for each capacitance circuit 345 in the output buffer 135 for individually controlling each of the capacitance circuits 345 in the output buffer 135. In these embodiments, the output buffer 135 has a slew rate configuration if each of the capacitance circuits 345 in the output buffer 135 is configured into the slew rate configuration of the capacitance circuit 345. Moreover, the output buffer 135 has a decoupling configuration if each of the capacitance circuits 345 in the output buffer 135 is configured into the decoupling configuration. Otherwise, if some of the capacitance circuits 345 in the output buffer 135 are configured into the slew rate configuration and some of the capacitance circuits 345 in the output buffer 135 are configured into the decoupling configuration, the output buffer 135 is configured into a slew rate decoupling configuration for reducing the slew rate of the buffered output signal 140 and increasing the power noise immunity of the output buffer 135. The method 700 then ends.

In various embodiments, the method 700 may include more or fewer steps than the steps 705-735 described above and illustrated in FIG. 7. In some embodiments, the steps 705-735 of the method 700 may be performed in a different order than that described above and illustrated in FIG. 7. For example, step 720 may be performed before step 715. In some embodiments, one or more of the steps 705-735 of the method 700 may be performed in parallel with each other or substantially simultaneously with each other. For example, steps 715 and 720 may be performed in parallel or substantially simultaneously with each other.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An integrated circuit device, comprising:
  a plurality of output buffers, wherein each output buffer is configured to receive a respective unbuffered output signal and generate a respective buffered output signal based on the unbuffered output signal, each output buffer comprising a capacitance circuit configurable into a selected one of a slew rate configuration for reducing a slew rate of the buffered output signal or a decoupling configuration for increasing power noise immunity of the output buffer; and
  an output buffer controller coupled to each of the output buffers via a respective select control signal,
  wherein the output buffer controller is further configured to individually select one of the slew rate configuration or the decoupling configuration of the capacitance circuit in each output buffer of the plurality of output buffers based on a value of the respective select control signal.

2. An integrated circuit device, comprising:
  an output buffer configured to receive an unbuffered output signal and generate a buffered output signal based on the unbuffered output signal, the output buffer comprising a capacitance circuit configurable into a selected one of a slew rate configuration for reducing a slew rate of the buffered output signal or a decoupling configuration for increasing power noise immunity of the output buffer; and
  an output buffer controller coupled to the output buffer and configured to select one of the slew rate configuration or the decoupling configuration of the capacitance circuit,
  wherein the output buffer further comprises:
    an input circuit configured to receive the unbuffered output signal, the input circuit further configured to generate an inverted output signal, a pullup control signal, and a pulldown control signal, based on the unbuffered output signal;
    an output circuit coupled to the input circuit, the output circuit configured to generate a pullup component signal based on the pullup control signal and to generate a pulldown component signal based on the pulldown control signal, the output circuit further configured to generate the buffered output signal comprising the pullup component signal and the pulldown component signal; and
    a biasing circuit coupled to the input circuit and the capacitance circuit, wherein the capacitance circuit is configured to generate a feedback signal based on the buffered output signal when the capacitance circuit is in the slew rate configuration, the biasing circuit is configured to generate a pullup bias signal for biasing the pullup control signal based on the inverted output signal and the feedback signal when the capacitance circuit is in the slew rate configuration, and the biasing circuit is further configured to generate a pulldown bias signal for biasing the pulldown control signal based on the inverted output signal and the feedback signal when the capacitance circuit is in the slew rate configuration.

3. An integrated circuit device, comprising:
  an output buffer configured to receive an unbuffered output signal and generate a buffered output signal based on the unbuffered output signal, the output buffer comprising a capacitance circuit configurable into a selected one of a slew rate configuration for reducing a slew rate of the buffered output signal or a decoupling configuration for increasing power noise immunity of the output buffer; and
  an output buffer controller coupled to the output buffer and configured to select one of the slew rate configuration or the decoupling configuration of the capacitance circuit,
  wherein:
    the output buffer comprises a plurality of capacitance circuits including the capacitance circuit,
    the output buffer controller is further configured to generate a respective select control signal for each capacitance circuit of the plurality of capacitance circuits, and
    each capacitance circuit of the plurality of capacitance circuits is configured to select one of the slew rate configuration or the decoupling configuration of the capacitance circuit based on a value of the select control signal received by the capacitance circuit.

4. The integrated circuit device of claim 3, wherein the capacitance circuit comprises:
  a capacitor having an input and an output;
  a first transmission gate configured to pass the buffered output signal from the output circuit to the input of the capacitor when the capacitance circuit is in the slew rate configuration, the capacitor further configured to generate the feedback signal at the output of the capacitor based on the buffered output signal in the slew rate configuration;

a second transmission gate configured to pass the feedback signal from the output of the capacitor to the biasing circuit when the capacitance circuit is in the slew rate configuration;

a third transmission gate configured to couple the input of the capacitor to a power potential of the output buffer when the capacitance circuit is in the decoupling configuration; and a fourth transmission gate configured to couple the output of the capacitor to a ground potential of the output buffer when the capacitance circuit is in the decoupling configuration.

5. The integrated circuit device of claim 3, wherein the capacitance circuit comprises:

a capacitor having an input and an output;

a first transmission gate configured to pass the buffered output signal from the output circuit to the input of the capacitor when the capacitance circuit is in the slew rate configuration, the capacitor further configured to generate the feedback signal at the output of the capacitor based on the buffered output signal in the slew rate configuration;

a second transmission gate configured to pass the feedback signal from the output of the capacitor to the biasing circuit when the capacitance circuit is in the slew rate configuration;

a third transmission gate configured to couple the input of the capacitor to a ground potential of the output buffer when the capacitance circuit is in the decoupling configuration; and a fourth transmission gate configured to couple the output of the capacitor to a power potential of the output buffer when the capacitance circuit is in the decoupling configuration.

6. The integrated circuit device of claim 3, wherein the integrated circuit device comprises a field programmable gate array.

7. An output buffer comprising:

an input circuit configured to receive an unbuffered output signal and to generate an inverted output signal, a pullup control signal, and a pulldown control signal, based on the unbuffered output signal;

an output circuit coupled to the input circuit, the output circuit configured to generate a pullup component signal based on the pullup control signal and to generate a pulldown component signal based on the pulldown control signal, the output circuit further configured to generate a buffered output signal comprising the pullup component signal and the pulldown component signal;

a capacitance circuit coupled to the output circuit and configurable into a selected one of a slew rate configuration for reducing a slew rate of the buffered output signal or a decoupling configuration for increasing power noise immunity of the output buffer, the capacitance circuit configured to generate a feedback signal based on the buffered output signal in the slew rate configuration; and a biasing circuit coupled to the input circuit and capacitance circuit, the biasing circuit configured to generate both a pullup bias signal for biasing the pullup control signal and a pulldown bias signal for biasing the pulldown control signal based on the feedback signal when the capacitance circuit is in the slew rate configuration.

8. The output buffer of claim 7, wherein the capacitance circuit is further configured to receive a select control signal and select one of the slew rate configuration or the decoupling configuration of the capacitance circuit based on a value of the select control signal.

9. The output buffer of claim 7, further comprising a plurality of capacitance circuits including the capacitance circuit, each capacitance circuit of the plurality of capacitance circuits coupled to the biasing circuit and the output circuit and configured to receive a respective select control signal and select one of the slew rate configuration or the decoupling configuration of the capacitance circuit for the respective capacitance circuit based on a value of the select control signal received by the respective capacitance circuit.

10. The output buffer of claim 7, wherein the input circuit comprises:

a first transistor having a gate configured to receive the unbuffered output signal, a source for coupling to a power potential of the output buffer, and a drain configured to generate a portion of the pullup control signal;

a second transistor having a gate configured to receive the unbuffered output signal, a source coupled to a ground potential of the output buffer, and a drain configured to generate a portion of the pullup control signal;

a third transistor having a gate configured to receive the unbuffered output signal, a source for coupling to the power potential of the output buffer, and a drain configured to generate a portion of the pulldown control signal; and a fourth transistor having a gate configured to receive the unbuffered output signal, a source coupled to a ground potential of the output buffer, and a drain configured to generate a portion of the pulldown control signal.

11. The output buffer of claim 7, wherein the biasing circuit comprises:

a fifth transistor having a gate configured to receive the inverted output signal, a drain configured to receive the feedback signal, and a source configured to generate the pullup bias signal; and a sixth transistor having a gate configured to receive the inverted output signal, a drain configured to receive the feedback signal, and a source configured to generate the pulldown bias signal.

12. The output buffer of claim 7, wherein the output circuit comprises:

a seventh transistor having a gate configured to receive the pullup control signal, a source for coupling to a power potential of the output buffer, and a drain configured to generate the pullup component signal; and a eighth transistor having a gate configured to receive the pulldown control signal, a source coupled to a ground potential of the output buffer, and a drain configured to generate the pulldown component signal.

13. The output buffer of claim 7, wherein the capacitance circuit comprises:

a capacitor having an input and an output;

a first transmission gate configured to pass the buffered output signal from the output circuit to the input of the capacitor when the capacitance circuit is in the slew rate configuration, the capacitor further configured to generate the feedback signal at the output of the capacitor based on the buffered output signal in the slew rate configuration;

a second transmission gate configured to pass the feedback signal from the output of the capacitor to the biasing circuit when the capacitance circuit is in the slew rate configuration;

a third transmission gate configured to couple the input of the capacitor to a power potential of the output buffer when the capacitance circuit is in the decoupling configuration; and a fourth transmission gate configured to couple the output of the capacitor to a ground potential of the output buffer when the capacitance circuit is in the decoupling configuration.

14. The output buffer of claim 7, wherein the capacitance circuit comprises:
   a capacitor having an input and an output;
   a first transmission gate configured to pass the buffered output signal from the output circuit to the input of the capacitor when the capacitance circuit is in the slew rate configuration, the capacitor further configured to generate the feedback signal at the output of the capacitor based on the buffered output signal in the slew rate configuration;
   a second transmission gate configured to pass the feedback signal from the output of the capacitor to the biasing circuit when the capacitance circuit is in the slew rate configuration;
   a third transmission gate configured to couple the input of the capacitor to a ground potential of the output buffer when the capacitance circuit is in the decoupling configuration; and
   a fourth transmission gate configured to couple the output of the capacitor to a power potential of the output buffer when the capacitance circuit is in the decoupling configuration.

15. A method of controlling a slew rate of an output buffer, the method comprising:
   receiving an unbuffered output signal at the output buffer;
   generating a pullup control signal based on the unbuffered output signal;
   generating a pulldown control signal based on the unbuffered output signal;
   generating a buffered output signal based on the pullup control signal and the pulldown control signal;
   receiving a select control signal; and
   selecting one of a slew rate configuration for reducing a slew rate of the buffered output signal or a decoupling configuration for increasing power noise immunity of the output buffer, based on a value of the select control signal, wherein at least one of the following applies:
   reducing the slew rate of the buffered output signal comprises:
      generating an inverted output signal based on the unbuffered output signal;
      generating a feedback signal based on the buffered output signal;
      generating a pullup bias signal for biasing the pullup control signal based on the inverted output signal and the buffered output signal; and
      generating a pulldown bias signal for biasing the pulldown control signal based on the inverted output signal and the buffered output signal,
or:
   increasing the power noise immunity of the output buffer comprises:
      coupling an input of a capacitor in the capacitance circuit to a power potential of the output buffer; and
      coupling an output of the capacitor to a ground potential of the output buffer,
or:
   increasing the power noise immunity of the output buffer comprises:
      coupling an input of a capacitor in the capacitance circuit to a ground potential of the output buffer; and
      coupling an output of the capacitor to a power potential of the output buffer,
or:
   the output buffer comprises a plurality of capacitance circuits, the method further comprising:
      receiving a respective select control signal at each capacitance circuit of the plurality of capacitance circuits; and
      selecting one of the slew rate configuration or the decoupling configuration of each capacitance circuit based on the respective select control signal received by the capacitance circuit.

* * * * *